(12) United States Patent
Hino

(10) Patent No.: US 9,698,078 B2
(45) Date of Patent: Jul. 4, 2017

(54) SEMICONDUCTOR MODULE AND METHOD FOR MANUFACTURING THE SAME

(71) Applicant: Mitsubishi Electric Corporation, Tokyo (JP)

(72) Inventor: Yasunari Hino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/445,411

(22) Filed: Jul. 29, 2014

(65) Prior Publication Data

US 2015/0130076 A1    May 14, 2015

(30) Foreign Application Priority Data

Nov. 12, 2013  (JP) ................................. 2013-233902

(51) Int. Cl.
  *H01L 23/433*   (2006.01)
  *H01L 23/495*   (2006.01)
  *H01L 23/00*    (2006.01)

(52) U.S. Cl.
  CPC .... *H01L 23/4334* (2013.01); *H01L 23/49524* (2013.01); *H01L 23/49575* (2013.01); *H01L 24/29* (2013.01); *H01L 24/33* (2013.01); *H01L 24/83* (2013.01); *H01L 23/49562* (2013.01); *H01L 24/45* (2013.01); *H01L 2224/29101* (2013.01); *H01L 2224/29339* (2013.01);
  (Continued)

(58) Field of Classification Search
  None
  See application file for complete search history.

(56) References Cited

U.S. PATENT DOCUMENTS 4,793,543 A * 12/1988 Gainey et al. ................ 228/121
5,842,275 A * 12/1998 McMillan, II .......... H01L 24/81
174/262
(Continued)

FOREIGN PATENT DOCUMENTS

CN          1348214 A       5/2002
DE    102007063308 A1       7/2009
(Continued)

OTHER PUBLICATIONS

Machine language translation of JP 2009-105456 A.*
(Continued)

*Primary Examiner* — Erik Kielin
(74) *Attorney, Agent, or Firm* — Studebaker & Brackett PC

(57) ABSTRACT

A semiconductor module of the present invention includes: a semiconductor element having a first main surface and a second main surface facing the first main surface, the semiconductor element including a front surface electrode and a back surface electrode on the first main surface and the second main surface, respectively; a metal plate electrically connected to the back surface electrode of the semiconductor element through a sintered bonding material including metal nanoparticles; and a plate-shaped conductor electrically connected to the front surface electrode of the semiconductor element through the sintered bonding material including the metal nanoparticles. The metal plate and the conductor include grooves communicating between a bonding region bonded to the semiconductor element and the outside of the bonding region.

12 Claims, 5 Drawing Sheets

(52) U.S. Cl.
CPC ............... *H01L 2224/29344* (2013.01); *H01L 2224/29347* (2013.01); *H01L 2224/29364* (2013.01); *H01L 2224/29369* (2013.01); *H01L 2224/40137* (2013.01); *H01L 2224/45015* (2013.01); *H01L 2224/45124* (2013.01); *H01L 2224/48091* (2013.01); *H01L 2224/48247* (2013.01); *H01L 2224/48472* (2013.01); *H01L 2224/73265* (2013.01); *H01L 2224/8384* (2013.01); *H01L 2224/83385* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 6,774,482 B2 * | 8/2004 | Colgan et al. | 257/712 |
| 8,718,720 B1 * | 5/2014 | Liu | H01L 29/0657 257/774 |
| 2001/0009301 A1 * | 7/2001 | Azuma | H01L 21/4832 257/698 |
| 2002/0041023 A1 | 4/2002 | Sakamoto et al. | |
| 2005/0263879 A1 * | 12/2005 | Michel | H01L 23/42 257/706 |
| 2010/0133666 A1 * | 6/2010 | Meyer-Berg | H01L 21/568 257/666 |
| 2010/0289127 A1 * | 11/2010 | Kanazawa et al. | 257/666 |
| 2012/0068357 A1 | 3/2012 | Saito et al. | |
| 2012/0224335 A1 * | 9/2012 | Yuan | H01L 23/3121 361/749 |
| 2012/0228776 A1 * | 9/2012 | Ohno | C23C 24/04 257/773 |
| 2013/0083489 A1 * | 4/2013 | Dimauro | H05K 1/111 361/719 |
| 2013/0087813 A1 * | 4/2013 | Yan et al. | 257/88 |
| 2013/0201631 A1 * | 8/2013 | Parker et al. | 361/728 |
| 2014/0151744 A1 * | 6/2014 | Lee | H01L 25/072 257/144 |
| 2014/0225274 A1 | 8/2014 | Guyenot et al. | |

FOREIGN PATENT DOCUMENTS

| | | | |
|---|---|---|---|
| DE | 102011078582 A1 | | 1/2013 |
| JP | 2002280503 A | * | 9/2002 |
| JP | 2006-202586 A | | 8/2006 |
| JP | 2006-269682 A | | 10/2006 |
| JP | 2007-214340 A | | 8/2007 |
| JP | 2009105456 A | * | 5/2009 |
| JP | 2012-069640 A | | 4/2012 |

OTHER PUBLICATIONS

Derwent Abstract of JP 2002-280503 A.*
An Office Action; "Notification of Reason(s) for Refusal" issued by the Japanese Patent Office on Sep. 27, 2016, which corresponds to Japanese Patent Application No. 2013-233902 and is related to U.S. Appl. No. 14/445,411; with English language partial translation.
An Office Action issued by the German Patent Office on Feb. 7, 2017, which corresponds to German Patent Application No. 10 2014 221 636.2 and is related to U.S. Appl. No. 14/445,411; with English language partial translation.
An Office Action issued by the Chinese Patent Office on Dec. 1, 2016, which corresponds to Chinese Patent Application No. 201410645842.2 and is related to U.S. Appl. No. 14/445,411; with English language translation.

* cited by examiner

SEMICONDUCTOR MODULE AND METHOD FOR MANUFACTURING THE SAME

BACKGROUND OF THE INVENTION

Field of the Invention

The present invention relates to a semiconductor module and more particularly to a bonding structure in wire connection inside the semiconductor module.

Description of the Background Art

In recent times, growing environmental regulations enhance demand for high-efficient and energy-saving semiconductor modules that are environmentally friendly. The semiconductor modules, which are used for industrial equipment, drive control devices of household appliances with motors, electric cars, vehicle-mounted control devices for hybrid cars, railway control devices, and photovoltaic power generation control devices, for example, are required to be compatible with high electric power. The semiconductor modules are used under high load conditions (high temperature conditions) particularly in the vehicle-mounted control devices and the railway control devices from the viewpoint of saving energy and suppressing conversion losses of electrical energy (increased Tj), whereby the semiconductor modules are required to operate with high efficiency and low losses even under the high temperature conditions. Specifically, the previous normal operating temperature has been 150° C. or less at Tj=125° C., but the semiconductor modules are assumed to operate under the high temperature conditions of 200° C. or more at Tj=175° C. in the future.

To suppress switching losses under the above-mentioned high temperature conditions to achieve low losses and high efficiency at the high temperature state, the material and the structure of the semiconductor modules are needed to be reconsidered. Particularly, the wire connection portion connected to the external electrode deteriorates most easily, so that high quality, high reliability, and long life of the wire connection portion are difficult to be achieved.

In a case of the conventional soldering material, for a semiconductor module in a sandwich structure having a semiconductor element sandwiched between metal plates, a back surface electrode and a front surface electrode of the semiconductor element are each subjected to soldering by heating. For this reason, if the front surface electrode of the semiconductor element is soldered after the back surface electrode of the semiconductor element is soldered, the heating upon soldering of the front surface electrode causes the solder of the back side of the semiconductor element to melt again. This progresses Ni erosion of the back surface coated with metals, resulting in separation of the semiconductor element.

There is a semiconductor module performing a wire connection using a sintered bonding material including metal nanoparticles in place of the soldering material (for example, see Japanese Patent Application Laid-Open No. 2007-214340).

However, even in the case of using the sintered bonding material, the back surface electrode and front surface electrode of the semiconductor element each requires a bonding step. The sintered bonding material is bonded from the longer thermal history under the higher temperature conditions than the soldering material, so that the thermal stress is generated on each component of the semiconductor module, resulting in distortion and warpage. The sintered bonding material has a structure in which the metal particles coated with the surface stabilizer are stably dispersed in the solvent, and the surface stabilizer (solvent) is vaporized by heating. Therefore, the solvent vaporized upon bonding of the back surface electrode adheres to the front surface electrode of the semiconductor element, and then the front surface electrode becomes contaminated, which prevents from securing the bonding quality in the bonding portions bonded to the front surface electrode.

SUMMARY OF THE INVENTION

It is an object of the present invention to provide a semiconductor module including a long-life wire connection portion having high bonding strength and to provide a method for manufacturing the semiconductor module.

The semiconductor module of the present invention includes a semiconductor element, a metal plate, and a conductor. The semiconductor element has a first main surface and a second main surface facing the first main surface, the semiconductor element including a front surface electrode and a back surface electrode on the first main surface and the second main surface, respectively. The metal plate is electrically connected to the back surface electrode of the semiconductor element through a sintered bonding material including metal nanoparticles. The plate-shaped conductor is electrically connected to the front surface electrode of the semiconductor element through the sintered bonding material including the metal nanoparticles. The metal plate and the conductor include a conductive path communicating between a bonding region bonded to the semiconductor element and the outside of the bonding region.

In the semiconductor module of the present invention, the metal plate and the conductor include the conductive path communicating between the bonding region bonded to the semiconductor element and the outside of the bonding region. Thus, the vaporized components of the sintered bonding material can be discharged to the outside of the bonding region through the conductive path, and pores at the bonding location can be suppressed to be generated. Therefore, the semiconductor module includes the long-life wire connection portion having high bonding strength.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

<A-1. Configuration>

Figure 1:
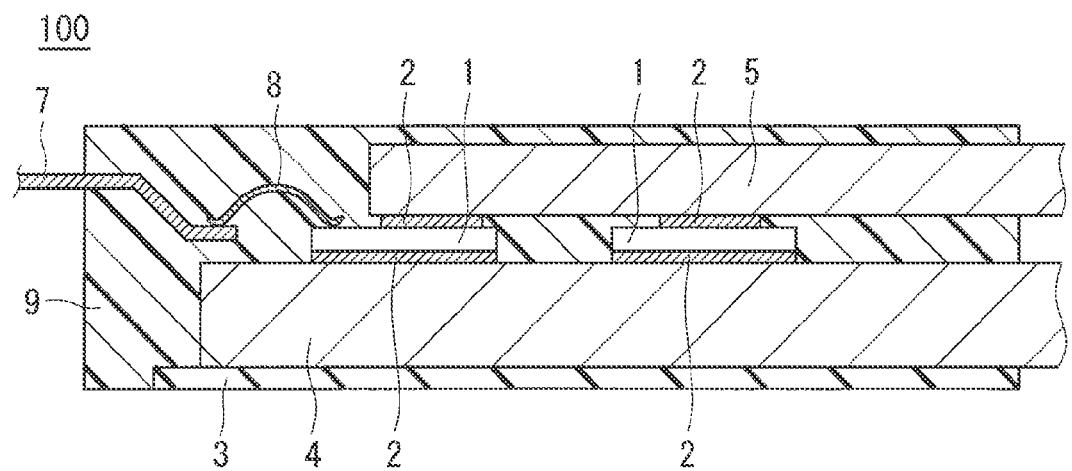
FIG. 1 is a cross-sectional view showing a configuration of a semiconductor module according to a first preferred embodiment.

FIG. 1 is a cross-sectional view showing a configuration of a semiconductor module 100 according to a first preferred embodiment of the present invention. In FIG. 1, the semiconductor module 100 includes two semiconductor elements 1, an insulating metal layer 3, a metal plate 4, a conductor 5, a signal terminal 7, a wire 8, and a sealing resin 9.

The semiconductor elements 1 include front surface electrodes on front surfaces (first main surfaces) and back surface electrodes on back surfaces (second main surfaces). If the semiconductor elements 1 are an IGBT, the front surface electrodes are a gate electrode and an emitter electrode, and the back surface electrodes are collector electrodes. As the semiconductor elements 1, the semiconductor module 100 uses two kinds of semiconductor elements in a pair, which are a semiconductor element such as the IGBT having the switching function and another semiconductor element having the diode function. A MOSFET and another transistor other than the IGBT may be used, but in the following descriptions, the semiconductor elements 1 are the IGBT and the diode.

The back surface electrodes of the semiconductor elements 1 are connected to the metal plate 4 with a sintered bonding material 2. The sintered bonding material 2 includes metal nanoparticles and a surface stabilizer (solvent) coating the metal nanoparticles. The metal nanoparticles are, for example, Ag, Cu, Au, Pd, and Pt having a diameter around several nm to 100 nm, and it will herein be described that Ag is used for the metal particles.

The metal plate 4 made of a copper or an alloy of copper is a plate having a thickness of about 3 mm to 5 mm or less. The metal plate 4 has high thermal conductivity of about 400 W/(m·K), having the function as a heat dissipation plate, and the metal plate 4 has low electrical resistance of about 2 μΩ·cm. The semiconductor elements 1 such as the MOSFET and the IGBT have a high heating value for controlling switching of a large current, to thereby require the metal plate 4 functioning as the high-thermal-conductivity heat dissipation plate. The metal plate 4 is connected to the external terminal, and thus the collector electrodes on the back surfaces of the semiconductor elements 1 are electrically connected to the external terminal through the metal plate 4.

The insulating metal layer 3 is bonded to a surface of the metal plate 4, the surface facing a bonding surface bonded to the semiconductor elements 1. The insulating metal layer 3 has a laminated structure of an insulating layer and a protective metal layer. An epoxy resin in which a filler such as boron nitride and alumina is mixed is used for the insulating layer, and the protective metal layer made of high-thermal-conductivity copper or aluminum is bonded to the insulating layer. The protective metal layer of the insulating metal layer 3 is bonded to the metal plate 4.

The heat generated from the semiconductor elements 1 is dissipated through the metal plate 4 and the insulating metal layer 3. The insulating metal layer 3 is connected to a cooling fin or a heat sink including a heat dissipation plate or a plurality of fins, and thus the insulating metal layer 3 has high heat dissipation properties or high cooling properties. This can suppress a rise in the temperature of the semiconductor elements 1.

The gate electrode on the surface of the semiconductor element 1 is connected to the signal terminal 7 with the wire 8. The signal terminal 7 sends input (switching ON/OFF control) to the semiconductor element 1 from the outside and controls the semiconductor element 1 from the outside. The emitter electrode on the surface of the semiconductor element 1 is connected to the conductor 5 for output to the outside. The conductor 5 made of a copper or an alloy of copper is a flat plate having a thickness of about 0.5 mm to 2.0 mm or less.

The above-mentioned structural components of the semiconductor module 100 are sealed with the resin 9. The back surface of the insulating metal layer 3 is exposed from the resin 9 in the diagram. However, the semiconductor module 100 may not include the insulating metal layer 3, and in this case, the back surface of the metal plate 4 is configured to be exposed from the resin 9.

Moreover, an insulating substrate (for example, a substrate made of ceramic such as aluminum nitride) may also be used in place of the metal plate 4 and the insulating metal layer 3.

Next, bonding portions of the front surface electrodes and the back surface electrodes of the semiconductor elements 1 will be described. Conventionally, a wire connection from a surface of a semiconductor element to an external electrode is solid-phase bonded by wire-bonding using a metal wire such as aluminum. In a power semiconductor module, to control switching of a large current, a plurality of metal wires are disposed in parallel and also the thick metal wires having a wire diameter of about 500 nm are adopted. However, an electric capacity and life of a bonding portion reach the limits. As the power semiconductor device is reduced in size, the size of the semiconductor element is also reduced, and thus an increase in the number of metal wires in parallel cannot be expected. Moreover, as the metal wires have a greater wire diameter, the applied pressure force and the applied vibration force upon bonding of the metal wires to the front surface electrodes of the semiconductor elements 1 are needed to be increased. However, if the amount of these forces becomes excessive, the semiconductor chip is destroyed. Furthermore, the power semiconductor device is needed to endure under the hostile environments, such as a heat cycle and a power cycle occurring in the wiring. The specification output of the power semiconductor device is on the increase to several hundreds of volts and to several thousands of volts, which also requires the wire connection portion to be compatible with the large current, to reduce the electrical resistance, and to achieve high reliability and long life even under the above-mentioned hostile environments.

In the semiconductor module 100, the conductor 5 including the high-electrical-conductivity copper or copper alloy is bonded to the front surface electrodes of the semiconductor elements 1 by heating and pressurizing through the sintered bonding material 2, to thereby perform the wire connection. The sintered bonding material 2 is configured to include the metal nanoparticles and the surface stabilizer coating the metal nanoparticles, the metal nanoparticles being, for example, Ag, Cu, Au, Pd, and Pt having the diameter around several nm to 100 nm. It will hereinafter be described that Ag is used for the metal particles.

The MOSFET, IGBT, or Di made of Si or SiC is used for the semiconductor elements 1 with a side of 7 mm to 15 mm. The front surface electrodes and back surface electrodes of the semiconductor elements 1 are coated with metals such as Ti—Ni—Au. The metallized front surface electrodes and the metallized back surface electrodes are bonded to the conductor 5 and the metal plate 4 through the sintered bonding material 2, respectively.

This bonding is a low-temperature sintering bonding exploiting a drop in the melting point caused by the nano-sized metal particles. The sintered bonding material 2 after bonding has a melting point about as high as that of a bulk material, to thereby obtain high heat resistance and high reliability.

In the sintered bonding material 2, the metal particles Ag are coated with the protective film (surface stabilizer), so that the metal particles Ag are stabilized without being bonded to one another. When the metal particles Ag are heated, the surface stabilizer (for example, organic matter) is vaporized, whereby the metal particles Ag are bonded to one another. Exploiting the sintering phenomenon in which the particles to be in nano size are agglomerated and bonded by the surface energy at a temperature lower than the melting point of the bulk eliminates the need for heating the semiconductor module to the high temperature as before, and thus thermal stress, distortion, or warpage caused by heating can be prevented.

<A-2. Conductive Path>

Figure 2:
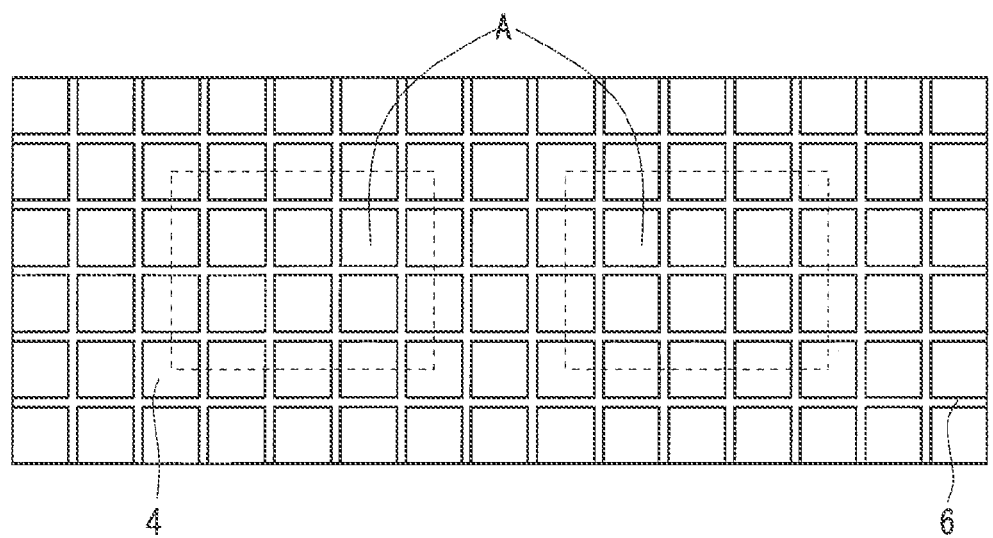
FIGS. 2 to 4 are plan views showing a configuration of a metal plate of the semiconductor module according to the first preferred embodiment.

FIG. 2 is a plan view of the metal plate 4 and shows the surface of the metal plate 4, the surface facing the semiconductor elements 1. In the bonding regions A as shown in FIG. 2, the metal plate 4 is bonded to the semiconductor elements 1 through the sintered bonding material 2. Grooves 6 through the bonding regions A are formed on the surface of the metal plate 4, the surface facing the semiconductor elements 1. The illustration is omitted, and the grooves 6 through the regions bonded to the semiconductor elements 1 are also formed on the surface of the conductor 5, the surface facing the semiconductor elements 1. The grooves 6 have a depth of 0.5 mm or more but less than 2.0 mm in a range which does not exceed the depth of the conductor 5.

The cause for forming the grooves 6 on the surfaces of the metal plate 4 and the conductor 5 will be described as follows, the surfaces facing the semiconductor elements 1. In the sintered bonding material 2, the protective film is formed around the metal particles Ag so as to prevent the metal particles Ag from being bonded to one another at room temperature. When the bonding portions are heated and pressurized, the protective film components (especially, organic solvent) are decomposed and vaporized at the temperature of around 100 to 150° C. However, in the structure having the surfaces of the sintered bonding material 2 sandwiched between the metal plate 4 and the conductor 5, even if the protective film components of the sintered bonding material 2 are vaporized, the protective film components are hardly discharged to the outside of the bonding portions, which causes a plurality of pores (voids) to be generated at the bonding location. As a result, the bonding strength is low, and the result of the reliability test such as a heat cycle test is poor, whereby sufficient bonding quality cannot be secured.

In the semiconductor module 100, the linear grooves 6 are provided on the bonding surfaces of the metal plate 4 and the conductor 5, to thereby secure the path for the protective film components being decomposed and vaporized to be discharged to the outside of the bonding portions by passing through the grooves 6. This can achieve the high quality bonding with a few pores (voids), and thus the semiconductor module 100 becomes highly reliable with high heat resistance.

The grooves 6 achieve to function as the discharging path for the vaporized components of the sintered bonding material 2, and the grooves 6 also achieve to improve adhesion properties of the metal plate 4 and the conductor 5 to the resin 9 using an anchor effect when the bonding portions of the semiconductor elements 1 are sealed with the resin 9. The grooves 6 secure the bonding area with the resin 9, which allows for miniaturization of the chip size of the semiconductor module and also leads to low costs.

Figure 3:
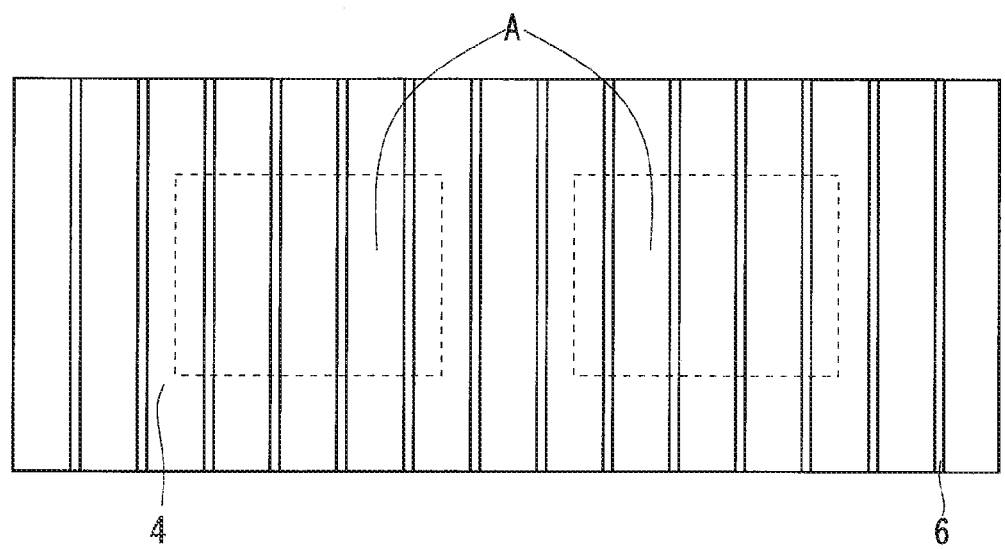

FIG. 2 shows the linear grooves 6 formed in a longitudinal direction (vertical direction in FIG. 2) and in a lateral direction (left-right direction in FIG. 2) across the entire surface of the metal plate 4, the surface facing the semiconductor elements 1. Meanwhile, the grooves 6 are provided to function as the path for discharging the vaporized components of the sintered bonding material 2 to the outside of the bonding portions, and thus it is sufficient that the grooves 6 function as the conductive path communicating from the bonding regions A to the outside of the bonding regions A. Therefore, as long as the grooves 6 are formed to extend through the bonding regions A, the grooves 6 may be formed only in the longitudinal direction of the metal plate 4 as shown in FIG. 3 or may be formed only in the lateral direction of the metal plate 4 (not shown). This can suppress the time to form the grooves 6 and the cost.

Figure 4:
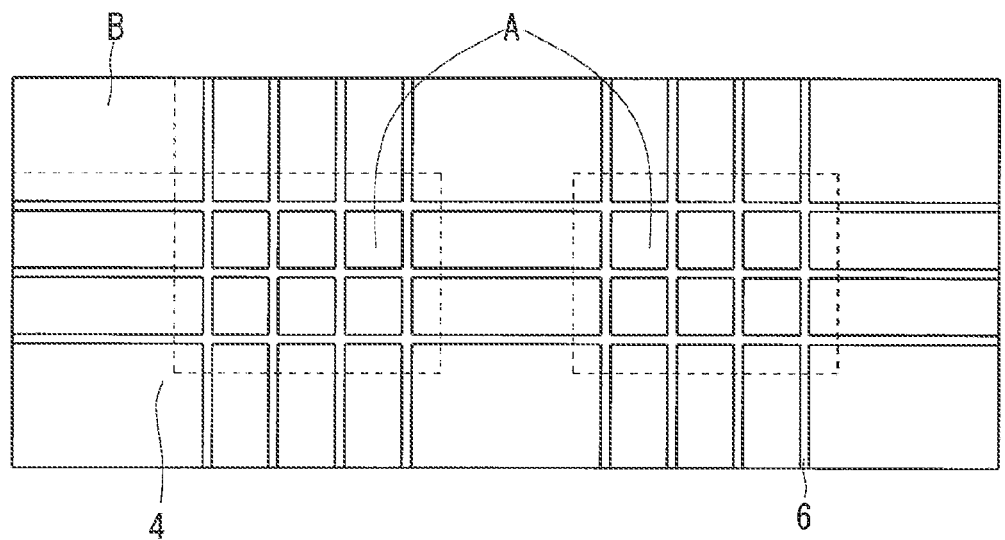

The grooves 6 are not necessarily formed across the entire surface of the metal plate 4, the surface facing the semiconductor elements 1. As shown in FIG. 4, only the grooves 6 (hereinafter, also referred to as a "first groove") through the bonding regions A may be formed. In other words, the grooves 6 are not formed in the region (region B in FIG. 4) where no linear grooves extending through the bonding regions A pass through. This can shorten the time to process the grooves 6 and suppress the manufacturing cost of the metal plate 4.

Figure 5:
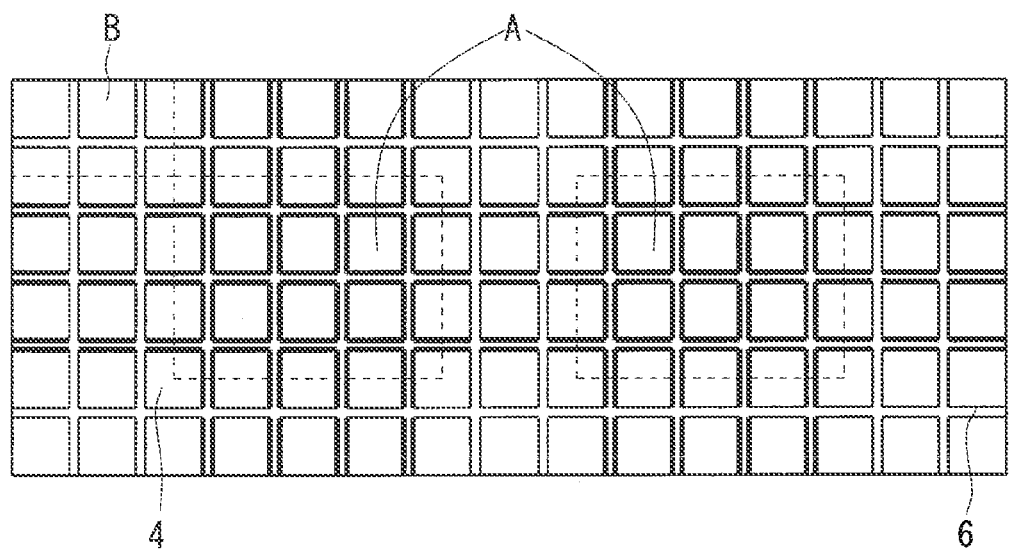
FIG. 5 is a plan view showing the metal plate of the semiconductor module according to the first preferred embodiment.

Of the grooves 6 formed on the surface of the metal plate 4 facing the semiconductor elements 1, the groove (hereinafter, also referred to as a "second groove") that does not pass through the bonding regions A achieves the anchor effect with the resin 9, but it does not function as the path for discharging the vaporized components of the sintered bonding material 2. As shown in FIG. 5, the first groove through the bonding regions A may have a width 1.5 to 3 times as much as a width (about 0.2 to 0.5 mm) of the second groove that does not pass through the bonding regions A. In this manner, even in a case where the sintered bonding material 2 having the great amount of the solvent and the vaporized components is used for bonding, the solvent can be caused to vaporize, which suppresses the occurrence of the pores (voids). As a result, the high quality bonding and the highly reliable semiconductor module can be obtained. Besides, the maximum width of the first groove is three times as much as the width of the second groove because the width greater than this does not have the anchor effect, which reduces the adhesion properties of the resin 9.

The grooves 6 formed on the surface of the metal plate 4 are described as above, the surface facing the semiconductor elements 1. The similar effects can be obtained if the grooves 6 are similarly formed on the surface of the conductor 5, the surface facing the semiconductor elements 1.

<A-3. Manufacturing Steps>

A method for manufacturing the semiconductor module 100 will be described. First, the paste-like sintered bonding material 2 is printed or applied on the bonding regions A on the metal plate 4. Subsequently, a mounting device such as a mounter mounts the semiconductor elements 1 on the metal plate 4. Then, the sintered bonding material 2 is applied on the surfaces (first surfaces) of the semiconductor elements 1, and the conductor 5 is mounted thereon.

Next, the metal plate 4 and the conductor 5 are collectively heated and pressurized to bond the metal plate 4 and the conductor 5 to the semiconductor elements 1. The temperature at this time is 200° C. to 350° C., and the applied pressure force is 8 MPa to 40 MPa. The heating and the pressurizing time are 10 to 120 minutes. The thickness of the bonding portions (sintered bonding material 2) after bonding is approximately 20 to 200 nm.

After the metal plate 4 and the conductor 5 are bonded to the semiconductor elements 1, one of the front surface electrodes of the semiconductor elements 1, which is not connected to the conductor 5, is wire-connected to the signal terminal 7 by a wedge bonding.

Next, the insulating metal layer 3 is bonded to the surface of the metal plate 4 opposite to the surface facing the semiconductor elements 1, and then the resin 9 molds the whole parts. At this time, the back surface of the insulating metal layer 3 and the portions of the metal plate 4 and of the conductor 5 are exposed from the resin 9.

The front surface electrodes of the semiconductor elements 1 and the back surface electrodes are bonded to the plate-shaped conductor 5 and the metal plate 4, respectively, which allows for the wire connection of the front surface electrodes and the back surface electrodes collectively performed in (one step) as described above. The sintered bonding material 2 has a structure in which the metal particles coated with the surface stabilizer are stably dispersed in the solvent, and the surface stabilizer (solvent) is vaporized by heating. Therefore, when the front surface electrodes are bonded after the back surface electrodes are bonded, the solvent vaporized upon bonding of the back surface electrodes adheres to the front surface electrodes of the semiconductor elements 1, and then the front surface electrodes become contaminated, which prevents from securing the bonding quality in the bonding portions bonded to the front surface electrodes. However, if the front surface electrodes and the back surface electrodes are collectively bonded, the high quality bonding can be achieved, and thus the highly reliable semiconductor module 100 can be obtained.

In addition, it is described above that the paste-like sintered bonding material 2 is used, but the pellet-shaped (solid) sintered bonding material 2 may be used.

<A-4. Modification>

Figure 6:
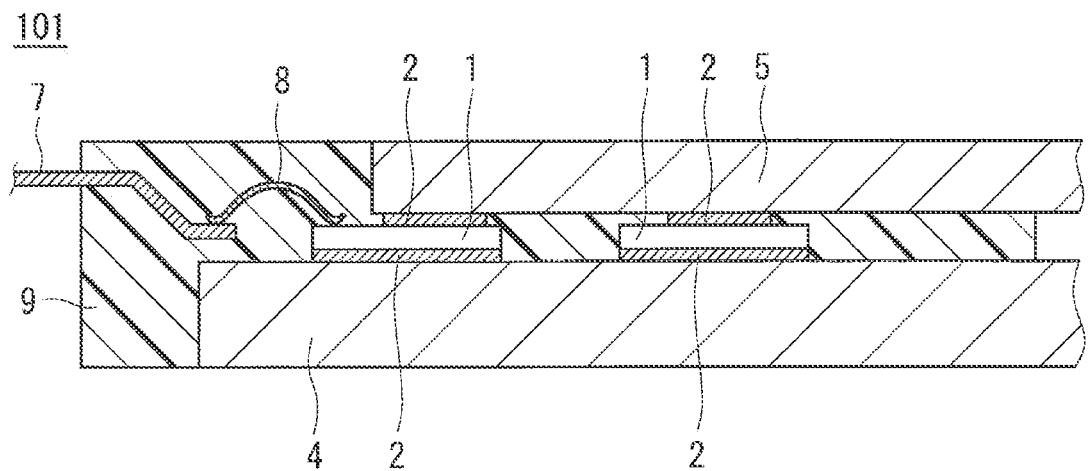
FIG. 6 is a cross-sectional view showing a configuration of a semiconductor module according to a modification of the first preferred embodiment.

In the semiconductor module 100 as shown in FIG. 1, the surface (upper surface) of the conductor 5 opposite to the surface facing the semiconductor elements 1 is not exposed from the resin 9. However, as in a semiconductor module 101 shown in FIG. 6, the upper surface of the conductor 5 may be exposed from the resin 9. The conductor 5 having a large heat capacity and having the function of heat dissipation (cooling) similarly to the metal plate 4 is exposed from the resin 9, and then a cooler provided with fins or a water-cooled cooler (not shown) are installed to the conductor 5 through a thermal grease material or a brazing material, which allows for heat dissipation from and cooling for both of the front surfaces and back surfaces of the semiconductor elements 1. In this manner, the switching losses of the semiconductor elements 1 caused by the temperature can be suppressed, and thus energy conservation and high efficiency can be achieved.

<A-5. Effects>

The semiconductor modules 100, 101 of the first preferred embodiment include the semiconductor elements 1 that have the first main surfaces and the second main surfaces facing the first main surfaces and include the front surface electrodes and the back surface electrodes on the first main surfaces and the second main surfaces, respectively, the metal plate 4 electrically connected to the back surface electrodes of the semiconductor elements 1 through the sintered bonding material 2 including the metal nanoparticles, and the plate-shaped conductor 5 electrically connected to the front surface electrodes of the semiconductor elements 1 through the sintered bonding material 2 including the metal nanoparticles. The metal plate 4 and the conductor 5 include the conductive path communicating between the bonding regions A bonded to the semiconductor elements 1 and the outside of the bonding regions A. Consequently, upon bonding of the metal plate 4 and the conductor 5 to the semiconductor elements 1, the conductive path discharges the vaporized components of the sintered bonding material 2 to the outside of the bonding regions A, achieving the high quality bonding with a few pores (voids), and thus the semiconductor module becomes highly reliable with high heat resistance.

If the grooves 6 are formed on the surfaces of the metal plate 4 and the conductor 5 facing the semiconductor elements 1 and the conductive path includes the first groove of the grooves 6, which extends through the bonding regions to the semiconductor elements 1, the vaporized components of the sintered bonding material 2 are discharged to the outside of the bonding regions A through the grooves 6 upon bonding of the metal plate 4 and the conductor 5 to the semiconductor elements 1. This achieves the high quality bonding with a few pores (voids), and thus the semiconductor module becomes highly reliable with high heat resistance.

The grooves 6 include the first groove that passes through the bonding regions A bonded to the semiconductor elements 1 and the second groove that does not pass through the bonding regions A, and the first groove has the width greater than the width of the second groove. Thus, even in a case where the sintered bonding material 2 having the great amount of the solvent and the vaporized components is used, the high quality bonding with a few pores (voids) can be obtained, and thus the semiconductor module becomes highly reliable with high heat resistance.

The grooves 6 (first groove) through the bonding regions A bonded to the semiconductor elements 1 may be the linear grooves formed from one end to the other end of the surfaces of the metal plate 4 and the conductor 5, the surfaces facing the semiconductor elements 1. This achieves the high quality bonding with a few pores (voids), and thus the semiconductor module becomes highly reliable with high heat resistance.

The method for manufacturing the semiconductor module 100 of the first preferred embodiment includes the steps of (a) disposing the first sintered bonding material 2 including the metal nanoparticles in the region of the metal plate 4, the region being to be bonded to the semiconductor elements 1, (b) disposing the semiconductor elements 1 such that the metal plate 4 is in contact with the back surfaces (second main surfaces) of the semiconductor elements 1 through the first sintered bonding material 2, (c) disposing the second sintered bonding material 2 including the metal nanoparticles on the front surfaces (first main surfaces) of the semiconductor elements 1, (d) disposing the conductor 5 on the front surfaces (first main surfaces) of the semiconductor elements 1 through the second sintered bonding material 2, and (e) collectively heating and pressurizing the metal plate 4 and the conductor 5 to bond the metal plate 4 and the conductor 5 to the semiconductor elements 1. The metal plate 4 and the conductor 5 are collectively bonded to the semiconductor elements 1, so that the high quality bonding can be obtained, and thus the highly reliable semiconductor module 100 can be obtained.

B. Second Preferred Embodiment

<B-1. Configuration>

Figure 7:
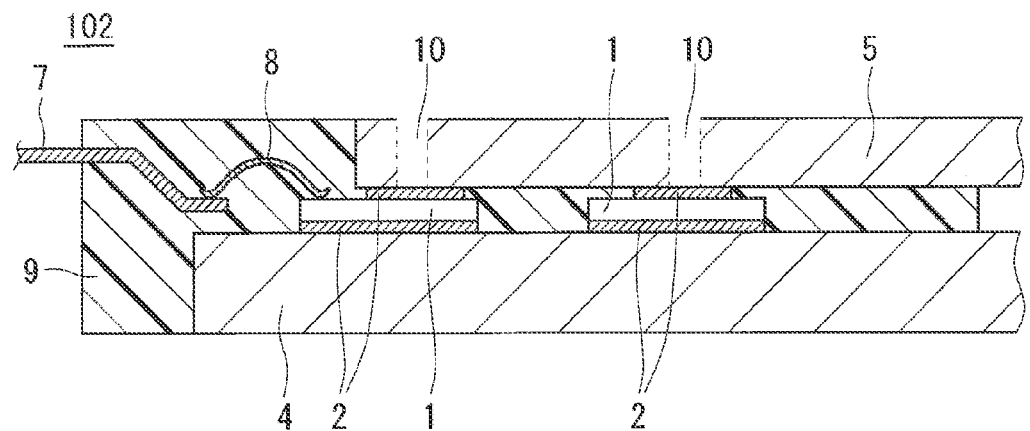
FIG. 7 is a cross-sectional view showing a configuration of a semiconductor module according to a second preferred embodiment.

FIG. 7 is a cross-sectional view showing a configuration of a semiconductor module 102 according to a second preferred embodiment. In the semiconductor modules 100, 101 of the first preferred embodiment, as the conductive path for discharging the vaporized components of the sintered bonding material 2 to the outside of the bonding portions, the grooves 6 are formed on the surfaces of the metal plate 4 and the conductor 5, the surfaces facing the semiconductor elements 1. In the semiconductor module 102 of the second preferred embodiment, as the conductive path, through-holes 10 extending from the back surface to the front surface of the conductor 5 are formed in place of the grooves 6.

Figure 8:
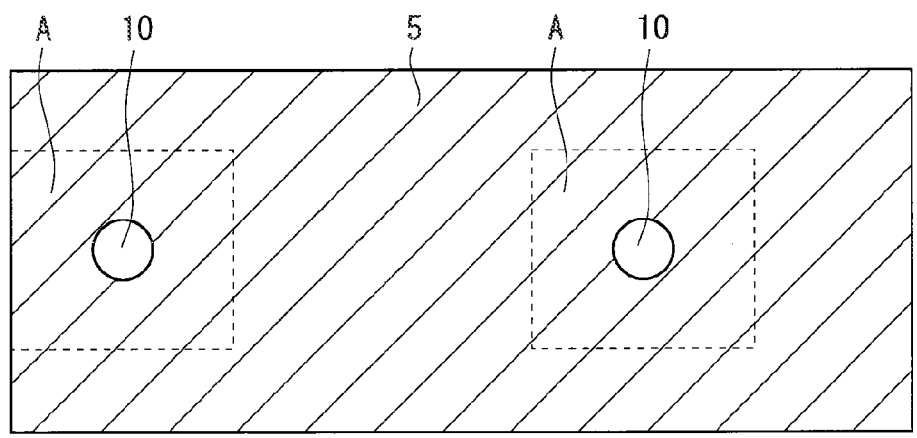
FIG. 8 is a plan view showing a conductor of the semiconductor module according to the second preferred embodiment.

FIG. 8 is a cross-sectional view of the conductor 5 in the semiconductor module 102. The through-holes 10 are formed through and the bonding regions A bonded to the conductor 5 and the semiconductor elements 1 to discharge the vaporized components of the sintered bonding material 2 to the outside of the bonding portions. A volume of the through-holes 10 can be made greater than a volume of the grooves 6 formed on the bonding regions, so that it is greatly easier to discharge the vaporized components of the sintered bonding material 2 compared to the first preferred embodiment. This can suppress the pores (voids) in the bonding portions between the front surface electrodes of the semiconductor elements 1 and the conductor 5 and also obtain the high quality bonding. With the through-holes 10 provided in the conductor 5, the bonding shape is a projection, which increases the bonding strength.

Figure 9:
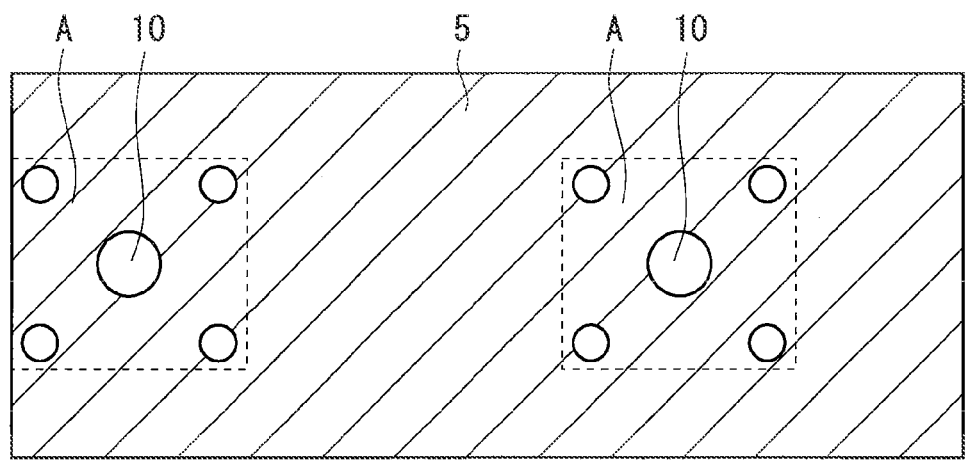
FIG. 9 is a plan view of a conductor of a semiconductor module according to a modification of the second preferred embodiment.

In FIGS. 7 and 8, the one through-hole 10 is formed in the one bonding region A, and as shown in FIG. 9, the plurality of through-holes 10 may also be formed. In this manner, the vaporized components of the sintered bonding material 2 can be discharged from the entire bonding regions A, and the high quality bonding portions suppressing the pores can be obtained. The sizes of the through-holes 10 may also vary from one another in the same bonding region A. For example, the through-hole 10 in the center of the bonding region A with a great amount of vaporization of the sintered bonding material 2 may have a diameter greater than diameters of the through-holes 10 around the center in the bonding region A (FIG. 9).

In addition, the through-holes 10 may not have a circular shape. The grooves 6 are formed on the metal plate 4 similarly to the first preferred embodiment. The configuration except for the through-holes 10 is similar to that of the semiconductor module 101 of the first preferred embodiment, so that the descriptions are omitted.

<B-2. Manufacturing Steps>

A method for manufacturing a semiconductor module 102 is the same as that of the first preferred embodiment. In other words, the metal plate 4 and the conductor 5 are collectively bonded to the back surface electrodes of the semiconductor elements 1 and the front surface electrodes of the semiconductor elements 1, respectively. It should be noted that after heating is started, pressure is not applied before reaching the sintered temperature of 80 to 130° C., and this temperature may be maintained for a fixed period of time (within 50 minutes). Subsequently, the heat is applied to increase the temperature while the pressure is applied, and thus the bonding is completed. In this case, by taking time below the sintered temperature, the solvent can be vaporized more sufficiently.

<B-3. Effects>

The semiconductor module 102 of the second preferred embodiment includes, as the conductive path for discharging the vaporized components of the sintered bonding material 2 to the outside of the bonding portions, the through-holes 10 extending from the bonding regions A of the metal plate 4 and the conductor 5 bonded to the semiconductor elements 1 to the surface opposite to the surface facing the semiconductor elements 1. This can suppress the pores (voids) in the bonding portions between the front surface electrodes of the semiconductor elements 1 and the conductor 5 and also obtain the high quality bonding. With the through-holes 10 provided in the conductor 5, the bonding shape is the projection, which increases the bonding strength.

The plurality of through-holes 10 are provided in the one bonding region A, so that the vaporized components of the sintered bonding material 2 can be discharged from the entire bonding regions A, and the high quality bonding portions suppressing the pores can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising:
   a semiconductor element having a first main surface and a second main surface facing said first main surface, the semiconductor element including a front surface electrode and a back surface electrode on said first main surface and said second main surface, respectively;
   a metal plate electrically connected to said back surface electrode of said semiconductor element through a sintered bonding material including metal nanoparticles, the location of the sintered bonding material on a surface of the metal plate being a bonding region; and
   a plate-shaped conductor electrically connected to said front surface electrode of said semiconductor element through the sintered bonding material including the metal nanoparticles, the location of the sintered bonding material on a surface of the plate-shaped conductor being another bonding region,
   wherein said metal plate and said plate-shaped conductor each include a plurality of first conductive paths extending along each said respective surface of said metal plate and said plate-shaped conductor from outside said respective bonding region bonded to said semiconductor element, across said respective bonding region, and extending outside of said respective bonding region such that at least one of the plurality of the first conductive paths extends from a first side of said semiconductor element to a second side of said semiconductor element, and at least one of the plurality of first conductive paths extends from a third side of said semiconductor element to a fourth side of said semiconductor element,
   wherein said metal plate and said plate-shaped conductor each include a plurality of second conductive paths extending along each said respective surface of said metal plate and said plate-shaped conductor, with at least one conductive path of said second conductive paths extending from a first edge of said respective surface of said metal plate and said plate-shaped conductor to a second edge opposite to the first edge of said respective surface of said metal plate and said plate-shaped conductor, and at least one conductive path of said second conductive paths extending along each said respective surface of said metal plate and said plate-shaped conductor from a third edge of said respective surface of said metal plate and said plate-shaped conductor that is different from the first and second edge to a fourth edge opposite to the third edge of said respective surface of said metal plate and said plate-shaped conductor, each of said plurality of second conductive paths intersecting at least one of the first plurality of conductive paths at a location outside said respective bonding region and each of said plurality of second conductive paths being non-intersecting with any bonding region, wherein each said conductive path of the first plurality of conductive paths and the second plurality of conductive paths opens onto each said respective surface of said metal plate and said plate-shaped conductor facing said semiconductor element in all regions of said metal plate and said plate-shaped conductor, wherein said first plurality of conductive paths is a first plurality of grooves, wherein said second plurality of conductive paths is a second plurality of grooves, and wherein each of said first plurality of grooves has a width greater than a width of each of said second plurality of grooves.

2. The semiconductor module according to claim 1, wherein each of said first plurality of grooves is a linear groove formed through said respective bonding region to extend from one end of said surface of a respective one of said metal plate and said plate-shaped conductor to the other end thereof, said surface of said respective metal plate and said plate-shaped conductor facing said semiconductor element.

3. A method for manufacturing the semiconductor module according to claim 1, comprising the steps of:
 (a) disposing a first sintered bonding material including metal nanoparticles in said bonding region of said metal plate;
 (b) disposing said semiconductor element such that said metal plate is in contact with said second main surface of said semiconductor element through said first sintered bonding material;
 (c) disposing a second sintered bonding material including metal nanoparticles on said first main surface of said semiconductor element;
 (d) disposing said plate-shaped conductor on said first main surface of said semiconductor element through said second sintered bonding material; and
 (e) collectively heating and pressurizing said metal plate and said plate-shaped conductor to bond said metal plate and said plate-shaped conductor to said semiconductor element.

4. A semiconductor module, comprising:
 a semiconductor element having a first main surface and a second main surface facing said first main surface, the semiconductor element including a front surface electrode and a back surface electrode on said first main surface and said second main surface, respectively;
 a metal plate electrically connected to said back surface electrode of said semiconductor element through a sintered bonding material including metal nanoparticles, the location of the sintered bonding material on a surface of the metal plate being a bonding region; and
 a plate-shaped conductor electrically connected to said front surface electrode of said semiconductor element through the sintered bonding material including the metal nanoparticles, the location of the sintered bonding material on a surface of the plate-shaped conductor being another bonding region, wherein said metal plate and said plate-shaped conductor each include a plurality of first conductive paths extending along each said respective surface of said metal plate and said plate-shaped conductor from outside said respective bonding region bonded to said semiconductor element, across said respective bonding region, and extending outside of said respective bonding region such that at least one of the plurality of the first conductive paths extends from a first side of said semiconductor element to a second side of said semiconductor element, and at least one of the plurality of first conductive paths extends from a third side of said semiconductor element to a fourth side of said semiconductor element, wherein said metal plate and said plate-shaped conductor each include a plurality of second conductive paths extending along each said respective surface of said metal plate and said plate-shaped conductor, with at least one conductive path of said second conductive paths extending from a first edge of said respective surface of said metal plate and said plate-shaped conductor to a second edge opposite to the first edge of said respective surface of said metal plate and said plate-shaped conductor, and at least one conductive path of said second conductive paths extending along each said respective surface of said metal plate and said plate-shaped conductor from a third edge of said respective surface of said metal plate and said plate-shaped conductor that is different from the first and second edge to a fourth edge opposite to the third edge of said respective surface of said metal plate and said plate-shaped conductor, each of said plurality of second conductive paths intersecting at least one of the first plurality of conductive paths at a location outside said respective bonding region and each of said plurality of second conductive paths being non-intersecting with any bonding region, wherein each said conductive path of the first plurality of conductive paths and the second plurality of conductive paths opens onto each said respective surface of said metal plate and said plate-shaped conductor facing said semiconductor element in all regions of said metal plate and said plate-shaped conductor, wherein said first plurality of conductive paths is a first plurality of grooves, and wherein said first plurality of grooves includes portions that extend beyond said respective bonding regions to outside of said respective bonding regions and said first plurality of grooves within said respective bonding regions have a density greater than said portions of said first plurality of grooves outside of said respective bonding regions.

5. The semiconductor module according to claim 4, wherein said plate-shaped conductor includes at least one hole formed in the bonding region.

6. The semiconductor module according to claim 5, wherein the at least one hole extends from a front surface of the plate-shaped conductor to a back surface of the plate-shaped conductor.

7. A semiconductor module, comprising:
a semiconductor element having a first main surface and a second main surface facing said first main surface, the semiconductor element including a front surface electrode and a back surface electrode on said first main surface and said second main surface, respectively;
a metal plate electrically connected to said back surface electrode of said semiconductor element through a sintered bonding material including metal nanoparticles; and
a plate-shaped conductor electrically connected to said front surface electrode of said semiconductor element through the sintered bonding material including the metal nanoparticles,
wherein each location of the sintered bonding material is the location of a bonding region,
wherein said metal plate includes a plurality of first conductive paths extending along a surface of the metal plate facing said semiconductor element from outside said bonding region bonded to said semiconductor element, across said bonding region, and extending outside of said bonding region such that at least one of the plurality of first conductive paths extends from a first side of said semiconductor element to a second side of said semiconductor element, and at least one of the plurality of first conductive paths extends from a third side of said semiconductor element to a fourth side of said semiconductor element,
wherein each said first conductive path of the plurality of first conductive paths opens onto the surface of the metal plate facing said semiconductor element in all regions of said metal plate,
wherein said metal plate includes a plurality of second conductive paths extending along the surface of said metal plate from a first edge of said surface of said metal plate to a second edge opposite to the first edge of said surface, and extending along said surface of said metal plate from a third edge of said respective surface that is different from the first and second edge to a fourth edge opposite to the third edge of said surface, each of said plurality of second conductive paths intersecting at least one of the first plurality of conductive paths at a location outside said bonding region, each of said plurality of second conductive paths being non-intersecting with any bonding region, and each said second conductive path of the plurality of second conductive paths opens onto the surface of the metal plate facing said semiconductor element in all regions of said metal plate,
wherein said plurality of first conductive paths is a first plurality of grooves,
wherein said plurality of second conductive paths is a second plurality of grooves, and
wherein each of said first plurality of grooves has a width greater than a width of each of said second plurality of grooves.

8. The semiconductor module according to claim 7, wherein each of said first plurality of grooves is a linear groove formed through said bonding region to extend from one end of the surface of said metal plate to the other end thereof, said surface facing said semiconductor element.

9. A method for manufacturing the semiconductor module according to claim 7, comprising the steps of:

(a) disposing a first sintered bonding material including metal nanoparticles in said bonding region of said metal plate;
(b) disposing said semiconductor element such that said metal plate is in contact with said second main surface of said semiconductor element through said first sintered bonding material; and
(c) collectively heating and pressurizing said metal plate to bond said metal plate to said semiconductor element.

10. The semiconductor module according to claim 7, wherein said bonding region includes grooves having a first width and the outside of said bonding region includes at least one groove having said first width and at least one groove having a second width different from the first width.

11. The semiconductor module according to claim 10, wherein at least one said groove having said first width intersects with at least one said groove having said second width.

12. A semiconductor module, comprising:
a semiconductor element having a first main surface and a second main surface facing said first main surface, the semiconductor element including a front surface electrode and a back surface electrode on said first main surface and said second main surface, respectively;
a metal plate electrically connected to said back surface electrode of said semiconductor element through a sintered bonding material including metal nanoparticles; and
a plate-shaped conductor electrically connected to said front surface electrode of said semiconductor element through the sintered bonding material including the metal nanoparticles,
wherein each location of the sintered bonding material is the location of a bonding region,
wherein said metal plate includes a plurality of first conductive paths extending along a surface of the metal plate facing said semiconductor element from outside said bonding region bonded to said semiconductor element, across said bonding region, and extending outside of said bonding region such that at least one of the plurality of first conductive paths extends from a first side of said semiconductor element to a second side of said semiconductor element, and at least one of the plurality of first conductive paths extends from a third side of said semiconductor element to a fourth side of said semiconductor element,
wherein each said first conductive path of the plurality of first conductive paths opens onto the surface of the metal plate facing said semiconductor element in all regions of said metal plate,
wherein said metal plate includes a plurality of second conductive paths extending along the surface of said metal plate from a first edge of said surface of said metal plate to a second edge opposite to the first edge of said surface, and extending along said surface of said metal plate from a third edge of said respective surface that is different from the first and second edge to a fourth edge opposite to the third edge of said surface, each of said plurality of second conductive paths intersecting at least one of the first plurality of conductive paths at a location outside said bonding region, each of said plurality of second conductive paths being non-intersecting with any bonding region, and each said second conductive path of the plurality of second conductive paths opens onto the surface of the metal plate facing said semiconductor element in all regions of said metal plate, wherein said plurality of first conductive paths is a first plurality of grooves, and wherein said first plurality of grooves includes portions that extend beyond said bonding region to outside of said bonding region and said first plurality of grooves within said bonding region have a density greater than said portions of said first plurality of grooves outside of said bonding region.

\* \* \* \* \*